(12) United States Patent
Kang et al.

(10) Patent No.: US 7,492,080 B2
(45) Date of Patent: Feb. 17, 2009

(54) PLASMA DISPLAY APPARATUS AND METHOD OF MANUFACTURING SAME

(75) Inventors: Tae-Kyoung Kang, Suwon-si (KR); Ki-Jung Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 453 days.

(21) Appl. No.: 11/187,094

(22) Filed: Jul. 22, 2005

(65) Prior Publication Data

US 2006/0158074 A1     Jul. 20, 2006

(30) Foreign Application Priority Data

Jan. 20, 2005   (KR)   .................. 10-2005-0005287

(51) Int. Cl.
*H01J 17/00* (2006.01)
(52) U.S. Cl. .................. 313/36; 313/581; 313/587; 313/584
(58) Field of Classification Search .................. 313/36, 313/46, 581–587; 445/24
See application file for complete search history.

(56) References Cited

U.S. PATENT DOCUMENTS

| | | | |
|---|---|---|---|
| 6,366,264 B1 * | 4/2002 | Kurumada | 345/60 |
| 6,433,489 B1 | 8/2002 | Tanaka et al. | |
| 6,494,429 B2 * | 12/2002 | Tajima | 361/681 |
| 6,630,284 B1 | 10/2003 | Maschwitz | |
| 6,794,633 B2 * | 9/2004 | Iwasaki | 250/221 |
| 2003/0173033 A1 | 9/2003 | Lee et al. | |

FOREIGN PATENT DOCUMENTS

| | | |
|---|---|---|
| CN | 1447167 A | 10/2003 |
| JP | 62-261154 | 11/1987 |
| JP | 02-158133 | 6/1990 |
| JP | 07-147141 | 6/1995 |
| JP | 07-318963 | 12/1995 |

(Continued)

OTHER PUBLICATIONS

Patent Abstracts of Japan, Publication No. 2001-084896, dated Mar. 30, 2001, in the name of Toshiyuki Okada et al.

(Continued)

*Primary Examiner*—Sikha Roy
*Assistant Examiner*—Natalie K Walford
(74) *Attorney, Agent, or Firm*—Christie, Parker & Hale, LLP (57) ABSTRACT

A plasma display apparatus and a method of manufacturing a plasma display apparatus are provided. According to the invention, the accuracy of alignment of the plasma display apparatus is improved. A plasma display apparatus according to one embodiment of the present invention comprises a plasma display panel for producing images and a chassis to which the plasma display panel is attached. The plasma display panel comprises at least one aligning mark and is attached to a first surface of the chassis. The chassis comprises at least one aligning hole corresponding in position to the position of the aligning mark on the plasma display panel. The chassis comprises aluminum and an anti-reflective material. The anti-reflective material is present in the chassis in an amount ranging from about 12 to about 26 parts by weight per 100 parts by weight aluminum.

21 Claims, 6 Drawing Sheets

FOREIGN PATENT DOCUMENTS

| | | |
|---|---|---|
| JP | 11-95196 | 4/1999 |
| JP | 11-109879 | 4/1999 |
| JP | 11-135500 | 5/1999 |
| JP | 2000-068632 | 3/2000 |
| JP | 2000-183572 | 6/2000 |
| JP | 2000-221321 | 8/2000 |
| JP | 2001-84896 | 3/2001 |
| JP | 2004-039409 | 2/2004 |
| KR | 2001-0043102 | 5/2001 |
| KR | 2003-0029697 | 4/2003 |

OTHER PUBLICATIONS

Korean Patent Avstracts, Publication No. 1020030029697 A, dated Apr. 16, 2003, in the name of Yeon Hong Jung.
Patent Abstracts of Japan, Publication No. JP 62-261154, published on Nov. 13, 1987 in the name of Tamaki et al.
Patent Abstracts of Japan, Publication No. JP 02-158133, published on Jun. 18, 1990 in the name of Madokoro.
Patent Abstracts of Japan, Publication No. JP 07-147141, published on Jun. 6, 1995 in the name of Tomihari.
Patent Abstracts of Japan, Publication No. JP 07-318963, published on Dec. 8, 1995 in the name of Tashiro.
Patent Abstracts of Japan, Publication No. JP 11-109879, published on Apr. 23, 1999 in the name of Tajima.
Patent Abstracts of Japan, Publication No. JP 11-135500, published on May. 21, 1999 in the name of Sugai.
Patent Abstracts of Japan, Publication No. JP 2000-068632, published on Mar. 3, 2000 in the name of Kawaguchi.
Patent Abstracts of Japan, Publication No. JP 2000-183572, published on Jun. 30, 2000 in the name of Mizuno.
Patent Abstracts of Japan, Publication No. JP 2000-221321, published on Aug. 11, 2000 in the name of Fukuda et al.
Patent Abstracts of Japan, Publication No. JP 2004-039409, published on Feb. 5, 2004 in the name of Takaoka.
Patent Abstracts of Japan, Publication No. 11-095196, dated Apr. 9, 1999, in the name of Shigeo Kayashima et al.

* cited by examiner

PLASMA DISPLAY APPARATUS AND METHOD OF MANUFACTURING SAME

CROSS REFERENCE TO RELATED APPLICATION

This application claims priority to and the benefit of Korean Patent Application No. 10-2005-0005287, filed on Jan. 20, 2005 in the Korean Intellectual Property Office, the entire content of which is incorporated herein by reference.

FIELD OF THE INVENTION

The present invention relates to a plasma display apparatus and a method of manufacturing a plasma display apparatus. In particular, the invention is directed to a plasma display apparatus having a chassis with reduced reflexibility.

BACKGROUND OF THE INVENTION

Plasma display panels (PDP) are display devices in which gas discharge creates plasma which generates ultraviolet rays in vacuum that excite phosphors to emit visible light and produce images. PDPs can have large screens and typically have high resolution, making them particularly attractive as next generation thin displays.

A plasma display apparatus having such a PDP comprises a PDP attached to one side of a chassis. Driving circuits for driving the PDP are attached to the other side of the chassis. The chassis serves not only to support the PDP, but also to simultaneously dissipate heat from the driving circuits.

In order to align the chassis with the PDP, an optical instrument detects an aligning mark on the PDP through a corresponding aligning hole on the chassis.

However, prior art plasma display apparatuses comprise chassis usually comprising materials having more than 97 wt % aluminum, in consideration of the high heat conductivity of the chassis. However, these materials may hinder detection of the aligning mark by the optical instrument due to the high reflexibility of outside light. Therefore, aluminum materials may cause misalignment of the chassis with the PDP.

SUMMARY OF THE INVENTION

According to one embodiment of the present invention, a plasma display apparatus and method of manufacturing a plasma display apparatus are provided. According to this embodiment, the accuracy of alignment between the chassis and the plasma display panel is improved by preventing misalignment.

A plasma display apparatus according to one embodiment of the present invention comprises a plasma display panel for displaying images attached to a first surface of a chassis. The plasma display panel comprises at least one aligning mark and the chassis comprises at least one aligning hole corresponding in position to the position of the aligning mark on the plasma display panel. The chassis comprises an anti-reflective material in an amount of about 12 to about 26 parts by weight per 100 parts by weight aluminum, wherein aluminum is the primary material of the chassis. The anti-reflective material may comprise a material selected from the group consisting of silicon, zinc, copper and mixtures thereof. In one embodiment, at least one of silicon, zinc and copper are used. In another embodiment, at least two of silicon, zinc and copper are used.

In one embodiment, the chassis comprises from about 10 to about 18 parts by weight silicon, per 100 parts by weight aluminum. The chassis further comprises from about 0 to about 4 parts by weight zinc, per 100 parts by weight aluminum. In addition, the chassis comprises from about 2 to about 4 parts by weight copper, per 100 parts by weight aluminum. The chassis may optionally further comprise less than about 0.2 parts by weight magnesium, and less than about 1.5 parts by weight iron as impurities. In one embodiment, the reflexibility of the chassis is less than about 45%.

According to another embodiment of the present invention, the plasma display apparatus comprises an anti-reflective layer positioned on a second surface of the chassis, wherein the second surface of the chassis is opposite the first surface.

In one embodiment, the anti-reflective layer covers the entire second surface of the chassis. The chassis comprises a primary material selected from the group consisting of aluminum and steel, and the anti-reflective layer may comprise zinc. For example, the chassis may comprise electrogaivanized iron.

In another embodiment, the anti-reflective layer may be positioned surrounding the aligning hole. In this embodiment, the anti-reflective layer is positioned along the perimeter of the aligning hole and may shaped to correspond to the perimeter of the aligning hole.

The anti-reflective layer surrounding the aligning hole is positioned near the corner of the chassis, may extend to the corner of the chassis, and may be shaped to correspond to the shape of the corner. The anti-reflective layer may shaped such that a region of the layer extends outside the chassis from the corner of the chassis.

The anti-reflective layer may comprise a material selected from the group consisting of plastic, metal, tape, silicon resin and graphite, and may be dark in color.

BRIEF DESCRIPTION OF THE DRAWINGS

These and other features and advantages of the present invention will be better understood by reference to the following detailed description when considered in conjunction with the accompanying drawings, in which.

DETAILED DESCRIPTION

Exemplary embodiments of the present invention will now be described in detail with reference to the accompanying drawings. However, one of ordinary skill in the art understands that various modifications may be made to the described embodiments, and that the invention is not limited to the described embodiments. Rather, the embodiments are described for illustrative purposes only.

Figure 1:
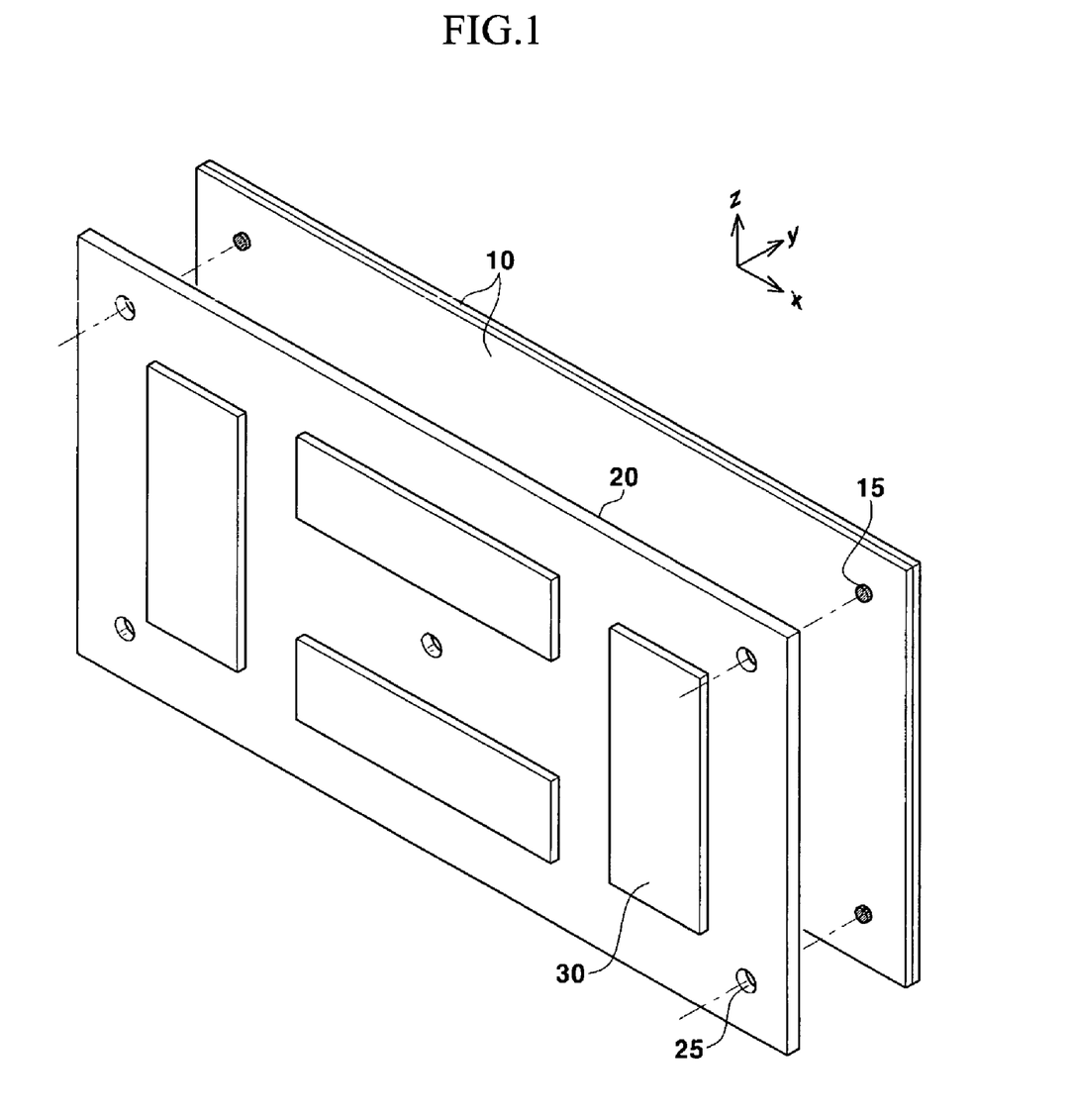
FIG. 1 is a perspective view of a disassembled plasma display apparatus according to one embodiment of the present invention.
Figure 2:
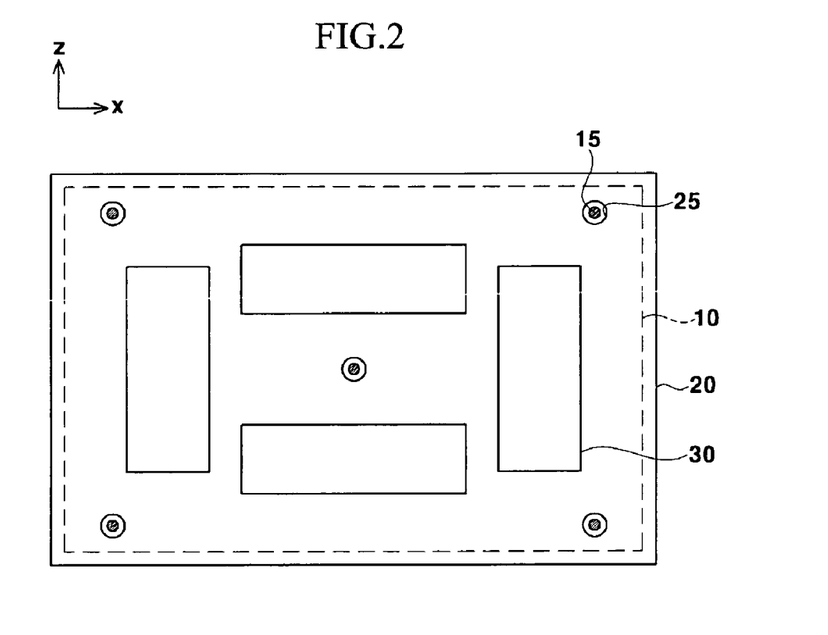
FIG. 2 is a plan view of the plasma display apparatus of FIG. 1.

FIG. 1 is a perspective view of a disassembled plasma display apparatus according to a first embodiment of the present invention. FIG. 2 is a plan view of the plasma display apparatus of FIG. 1. As shown in FIGS. 1 and 2, a plasma display apparatus according to one embodiment of the present invention comprises a chassis 20, a plasma display panel ("panel") 10 attached to a first surface of the chassis 20, and at least one driving circuit 30 for driving the panel 10. The driving circuits 30 are attached to a second surface of the chassis, wherein the second surface is opposite the first surface. The chassis 20 is positioned adjacent and substantially parallel to the panel 10. A heat conduction medium (not shown) may be positioned between the panel 10 and the chassis 20.

A front cover (not shown) is positioned over the panel 10, and a back cover is positioned over the chassis 20. All of the components are assembled into a plasma display apparatus.

The panel 10 comprises at least one aligning mark 15, and the chassis 20 comprises at least one aligning hole 25 at a position corresponding to the position of the aligning mark 15. The aligning hole 25 may have a width greater than a width of the aligning mark 15 so that the entire aligning mark 15 is positioned inside the aligning hole 25 to enable accurate alignment.

FIGS. 1 and 2 illustrate circular aligning marks 15 and aligning holes 25 positioned at four corners of the panel 10 and at the center of the panel 10. However, it is understood that the aligning marks 15 and aligning holes 25 make take any suitable shape, and are not limited by the exemplary embodiment illustrated in FIGS. 1 and 2. Therefore, the aligning marks 15 and the aligning holes 25 may vary in shape and placement as long as they correspond to each other in shape and placement.

The chassis 20 dissipates heat generated from the driving board 30 during image generation on the panel 10. The chassis 20 also securely support the panel 10. For efficient heat dissipation, the chassis 20 comprises aluminum (Al), which has high thermal conductivity, as the primary material.

To reduce reflexibility of the chassis 20, the chassis 20 may comprise an anti-reflective material. The anti-reflective material may be present in the chassis in an amount of about 12 to about 26 parts by weight per 100 parts by weight aluminum. Silver-white materials have high reflexibility and are not as useful as the anti-reflective material. In one exemplary embodiment, the anti-reflective material is one having a color selected from the group consisting of red, blue, green and combinations thereof, because these colors reduce reflexibility of the chassis 20.

When the anti-reflective material is present in the chassis 20 in an amount less than about 12 parts by weight, the reduction in reflexibility is insignificant. When the anti-reflective material is present in the chassis 20 in an amount more than about 26 parts by weight, the thermal conductivity of the chassis 20 is reduced due to the reduced amount of aluminum in the chassis 20. Therefore, the amount of anti-reflective material is determined according to both reflexibility and thermal conductivity of the chassis 20.

The anti-reflective material may comprise a material selected from the group consisting of silicon (Si), zinc (Zn), copper (Cu) and mixtures thereof. In one embodiment, the anti-reflective material comprises at least one of Si, Zn and Cu. In another embodiment, the anti-reflective material comprises at least two of Si, Zn and Cu.

In one embodiment, the chassis 20 may comprise a blue-red silicon in an amount of about 10 to about 18 parts by weight per 100 parts by weight aluminum. In addition, the chassis may comprise a blue zinc in an amount of about 0 to about 4 parts by weight per 100 parts by weight aluminum. The chassis may also comprise a red copper in an amount of about 2 to about 4 parts by weight per 100 parts by weight aluminum. Also, the content of silicon, zinc and copper is determined by consideration of thermal conductivity as well as reflexibility of the chassis 20.

In another embodiment, the chassis 20 comprises a reduced amount of silver-white impurities, such as chrome and magnesium (Mg). For example, the chassis 20 may comprise less than about 0.2 parts by weight magnesium per 100 parts by weight aluminum, no chrome and less than about 1.5 parts by weight iron (Fe) per 100 parts by weight aluminum.

The chassis 20 may be manufactured by forming alignment holes 25 in a plate comprising about 12 to about 26 parts by weight of an anti-reflective material per 100 parts by weight aluminum parts by weight.

The chassis 20 not only supports the panel 10 and dissipates heat from the driving circuits 30, but also effectively reduces reflexibility of the chassis 20 by inclusion of anti-reflective materials in a proper weight ratio. Specifically, reflexibility of the chassis 20 can be effectively reduced to below 45% by including the proper amount of anti-reflective materials and by reducing the amount of impurities having high reflexibility. Therefore, the occurrence of misalignment of the chassis 20 and the panel 10 may be reduced during alignment with an optical instrument.

Figure 3:
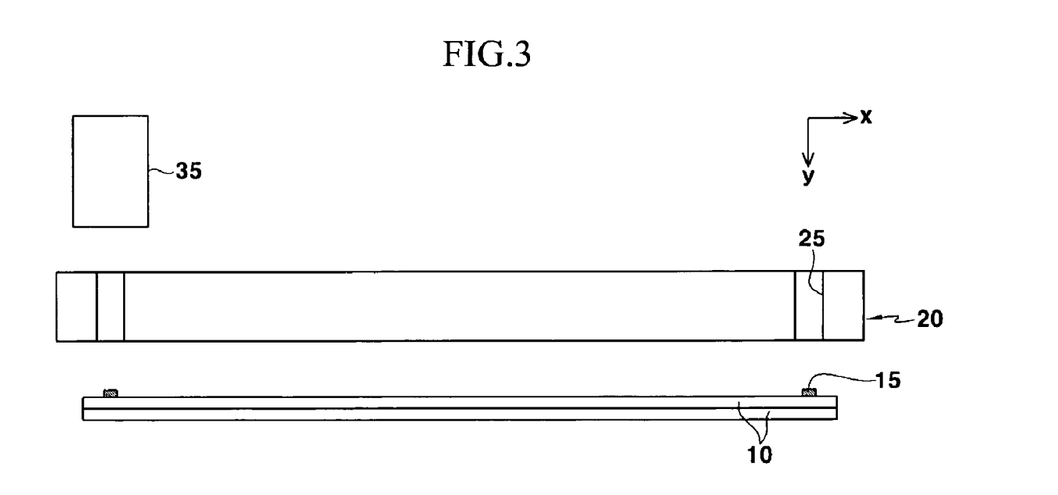
FIG. 3 is a schematic cross-sectional view of the plasma display apparatus of FIG. 1, illustrating a method of aligning a chassis with a plasma display panel according to one embodiment of the present invention.

FIG. 3 is a schematic view illustrating a method of aligning the plasma display apparatus according to a first embodiment of the present invention. As shown in FIG. 3, the chassis 20 is positioned over the panel 10 and separated from the panel by a predetermined distance. An optical instrument 35 is positioned over the chassis 20 and separated from the chassis 20 by a predetermined distance. The optical instrument 35 aligns the chassis 20 with the panel 20 such that the entire aligning mark 15 of the panel 20 is positioned inside the aligning hole 25 of the chassis 20. The panel 10 is then attached to the chassis 20, while maintaining alignment.

The following examples illustrate one embodiment of the present invention in more detail. However, it is understood that the present invention is not limited by these examples.

EXAMPLE 1

The chassis and panel according to the above described embodiment of the present invention were prepared, and the content and reflexibility of the chassis were measured with a Minolta spectrometer (CM-2600D).

The chassis and panel were aligned with each other with an optical instrument which detected the aligning mark on the panel through the aligning hole on the chassis. External light having 150 lux was used for the alignment.

COMPARATIVE EXAMPLE 1

The content and reflexibility of a prior art chassis containing more than 97% aluminum was also measured. The prior art chassis and panel are aligned with each other with an optical instruction which detected the aligning mark on the panel through the aligning hole on the chassis. The conditions for reflexibility measurements and alignment were identical to those used in Example 1.

Table 1 lists the compositions (in parts by weight) and reflexibilities of the chassis according to Example 1 and the chassis according to Comparative Example 1.

TABLE 1

| | Composition [parts by weight] | | | | | | Reflexibility |
|---|---|---|---|---|---|---|---|
| | Al | Si | Zn | Cu | Fe | Mg | Cr | [%] |
| Example 1 | 100 | 10-18 | 0-4 | 2-4 | Below 1.5 | Below 0.2 | — | 45 |
| Comparative Example 1 | 100 | Below 0.3 | Below 0.1 | Below 0.1 | Below 0.4 | 2.25-2.9 | 0.15-0.35 | 50 |

As shown in Table 1, the anti-reflective materials silicon, zinc and copper are present in Example 1 in a total amount of about 10 to about 26 parts by weight per 100 parts by weight aluminum. In contrast, the anti-reflective materials are present in Comparative Example 1 in an amount of less than about 0.5 parts by weight per 100 parts by weight aluminum. In addition, the content of Magnesium and chrome, which may increase reflexibility of the chassis, is less in the Example 1 than in Comparative Example 1.

Accordingly, as shown in Table 1, the reflexibility of the chassis of Example 1 is 45%, the reflexibility of the chassis of Comparative Example 1 is 50%. As a result, misalignment occurred during alignment of the chassis of Comparative Example 1, while no misalignment occurred during alignment of the chassis of Example 1. This shows that the reflexibility of the chassis is effectively reduced by including a proper amount of anti-reflective material in the chassis, as in Example 1. Consequently, in Example 1, accuracy of alignment of the chassis and the panel is increased, thereby reducing the occurrence of misalignment.

Alternative plasma display apparatuses and methods of manufacturing them will now be described in detail. The basic components of these alternative embodiments are similar to those of the first embodiment described above. Therefore, like reference numerals are used to describe the similar components in order to omit repetitive descriptions of the same or similar components.

Figure 4:
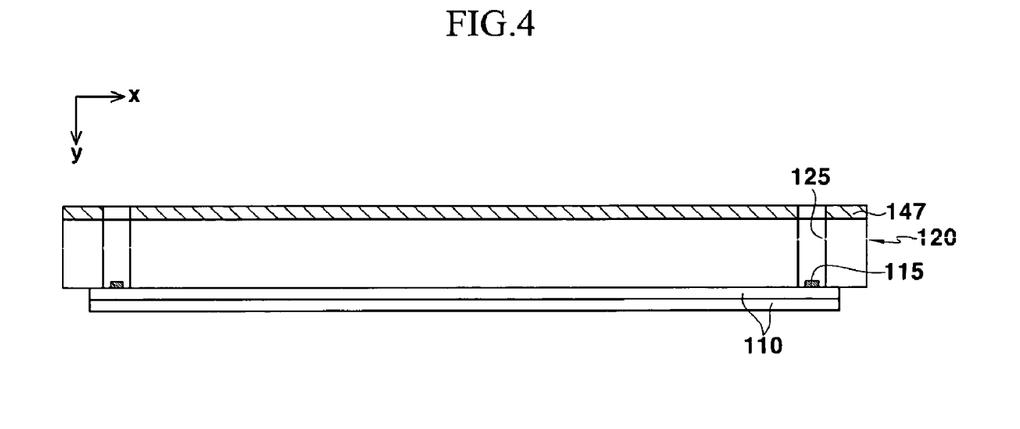
FIG. 4 is a cross-sectional view of a plasma display apparatus according to an alternative embodiment of the present invention.
Figure 5:
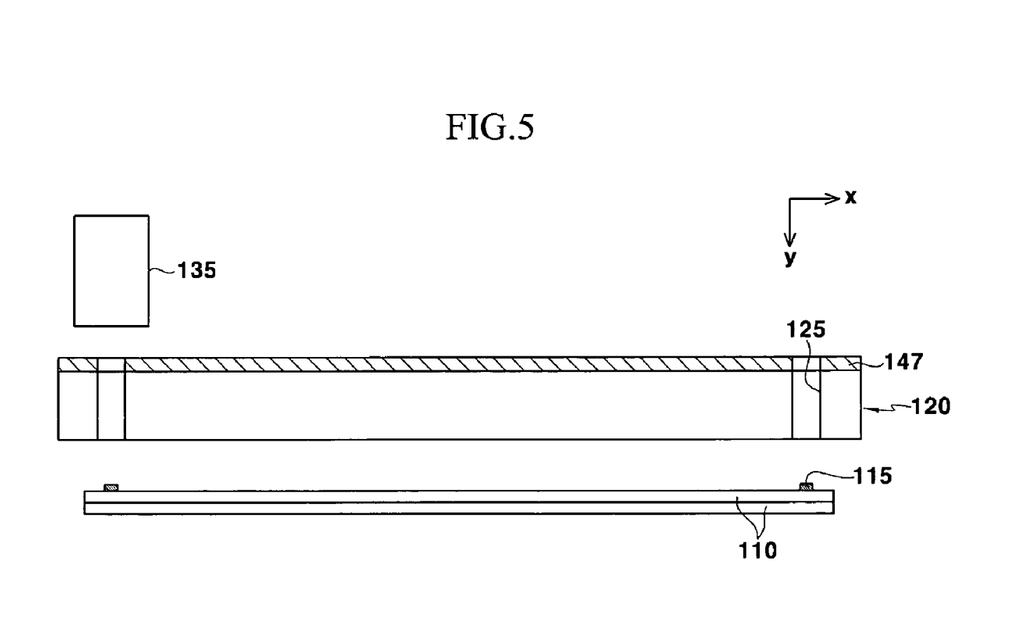
FIG. 5 is a schematic cross-sectional view of the plasma display apparatus of FIG. 4, illustrating a method of aligning a chassis with a plasma display panel according to one embodiment of the present invention.

In one alternative embodiment, as shown in FIGS. 4 and 5, a chassis 120 comprises at least one aligning hole 125 at a position corresponding to the at least one aligning mark 115 of the panel 110. An anti-reflective layer 147 is positioned on the second surface of the chassis 120, wherein the second surface is opposite the first surface to which the panel 110 is attached.

In this embodiment, the chassis 120 may comprise a primary material selected from the group consisting of aluminum and steel, and the anti-reflective layer 147 may comprise zinc. The anti-reflective layer 147 may be formed by galvanization. For example, the chassis 140 may comprise electrogalvanized iron (EGI), i.e. a chassis formed by galvanizing an iron plate in an electrolyte. Electrogalvanized iron has excellent machinability and can be used with a wide range of materials because the galvanizing temperature is close to room temperature, and the materials maintain their original characteristics.

The chassis 120 of this embodiment may be manufactured by positioning alignment holes 125 in a plate comprising aluminum or steel as the primary material and having a zinc layer formed on one surface of the chassis 120.

As shown in FIG. 5, the chassis 120 and the panel 110 of this embodiment are aligned by positioning the first surface of the chassis 120 over the panel 110 and separating the chassis 120 from the panel 110 by a predetermined distance. The second surface of the chassis 120, which comprises the anti-reflective layer 147, faces away from the panel 110. An optical instrument 135 is positioned over the anti-reflective layer 147 of the chassis 120 and separated from the chassis 120 by a predetermined distance. The anti-reflective layer 147 may comprise zinc, an anti-reflective material which reduces the reflection of outside light. The anti-reflective layer 147 faces the optical instrument 135. The chassis 120 and the panel 110 are aligned with each other by the optical instrument 135, which detects the aligning mark 115 through the aligning hole 125.

In this embodiment, the reflection of outside light is effectively reduced during alignment by the anti-reflective layer 147, which may comprise zinc, an anti-reflective material. The anti-reflective layer 147 faces the optical instrument 135. Therefore, misalignment, which may occur due to the reflection of outside light, is prevented.

Figure 6:
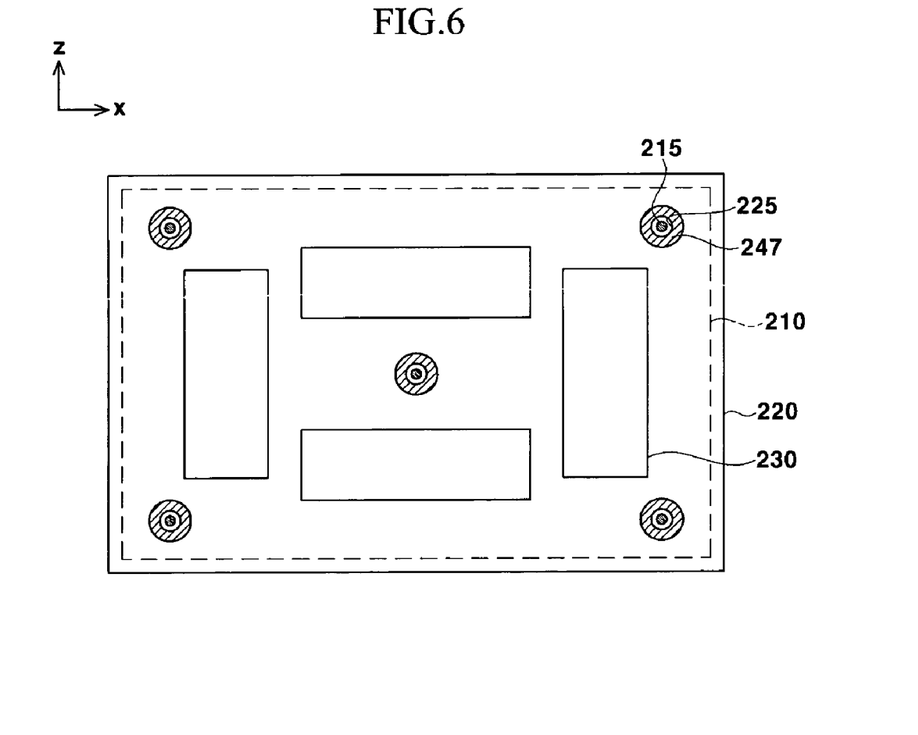
FIG. 6 is a plan view of a plasma display apparatus according to yet another embodiment of the present invention.
Figure 7:
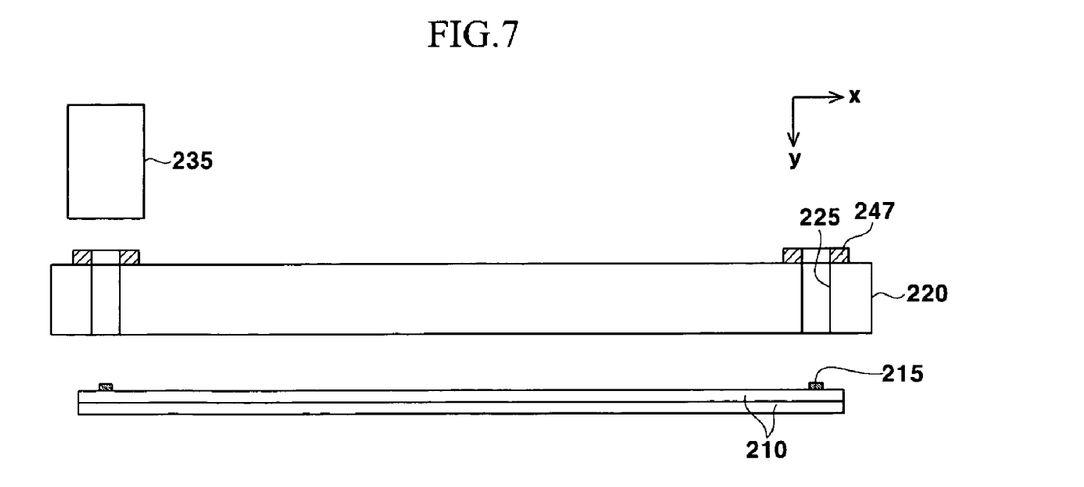
FIG. 7 is a schematic cross-sectional view of the plasma display apparatus of FIG. 6, illustrating a method of aligning a chassis with a plasma display panel according to one embodiment of the present invention.

FIG. 6 is a plan view of a plasma display apparatus according to yet another embodiment of the present invention. FIG. 7 is a schematic cross-sectional view of the plasma display apparatus of FIG. 6, illustrating a method of aligning the plasma display apparatus according to this embodiment of the present invention. As shown in FIG. 6, a chassis 220 comprises at least one aligning hole 225 at a position corresponding to the position of the aligning mark 215 of the panel 210. In this embodiment, an anti-reflective layer 247 surrounds the perimeter of the aligning hole 225 of the chassis 220. The anti-reflective layer 247 is shaped to correspond to the shape of the perimeter of the aligning hole 225. In the depicted embodiment, the anti-reflective layer is circular in shape, corresponding to the circular shape of the aligning hole 225.

The anti-reflective layer 247 may comprises a material selected from the group consisting of plastic, metal, tape, silicon resin and graphite. The anti-reflective layer 247 may be dark in color to prevent reflection of outside light.

The anti-reflective layer 247 can be positioned on the chassis 220 by first forming the aligning hole 225 and then attaching plastic, metal, tape or the like or spreading silicon resin or graphite around the aligning hole 225. Alternatively, an anti-reflective material such as plastic, metal or tape is first attached to the chassis 220, or silicon resin or graphite is first spread on the chassis 220 in the area where the aligning hole 225 will be formed. The anti-reflective material is applied in an area larger than the aligning hole. Then, the aligning hole 225 is formed inside the area where the anti-reflective material is applied.

As shown in FIG. 7, the first surface of the chassis 220 is positioned over the panel 210 and separated from the panel 210 by a predetermined distance. The second surface of the chassis 220, which comprises the anti-reflective layer 247, faces away from the panel 210. An optical instrument 235 is positioned over the anti-reflective layer 247 of the chassis 220 and separated from the chassis 220 by a predetermined distance. The chassis 220 and the panel 210 are aligned with each other by the optical instrument 135, which detects the aligning mark 215 through the aligning hole 225.

Since the reflection of outside light is minimized in the area around the aligning hole 225 where alignment is conducted, accuracy of alignment is improved. Because the anti-reflective layer 247 is positioned only in the area around the aligning hole, increased accuracy of alignment is achieved without any major alteration to the design of the chassis 220.

In the depicted embodiment, the anti-reflective layer 247 is positioned in the entire area surrounding the aligning hole 225, as shown in FIG. 6. However, it is understood that the anti-reflective layer 225 may only partially surround the aligning hole.

Figure 8:
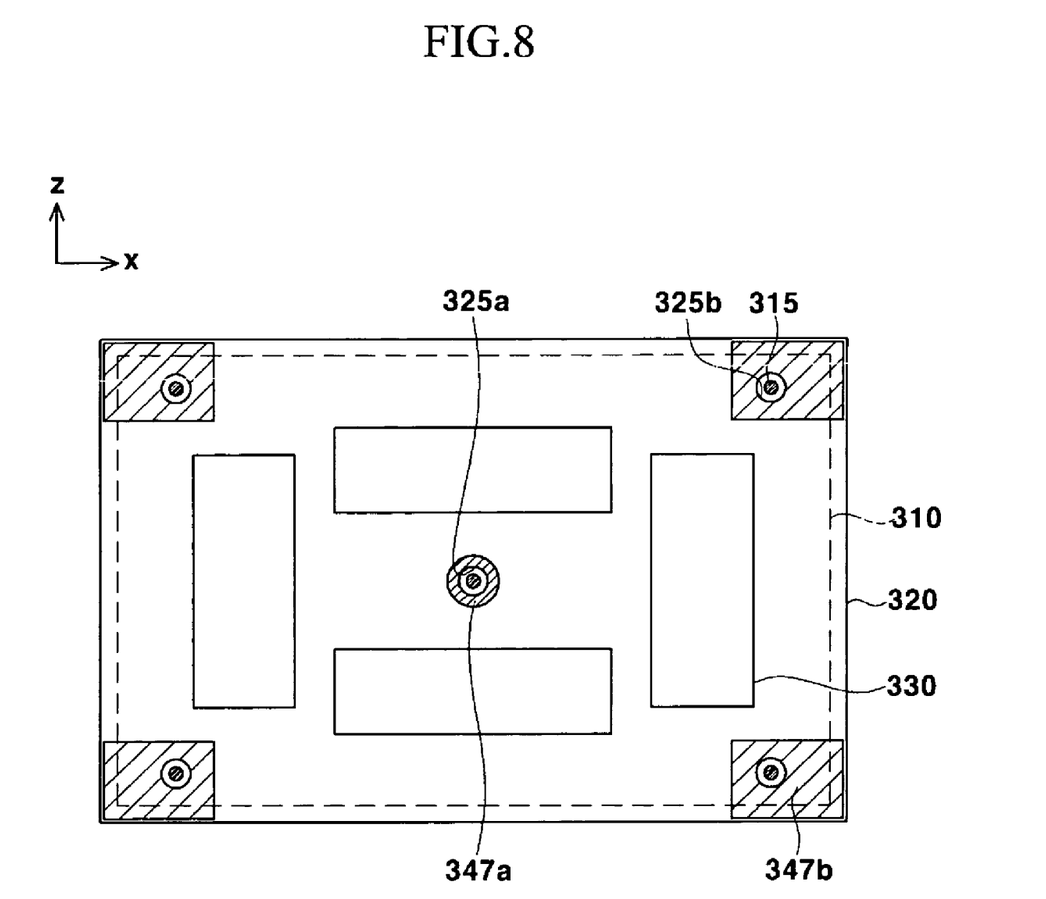
FIG. 8 is a plan view of a plasma display apparatus according to still another embodiment of the present invention.

FIG. 8 is a plan view of a plasma display apparatus according to still yet another embodiment of the present invention. In this embodiment, as shown in FIG. 8, the chassis 320 comprises at least one center aligning hole 325a positioned near the center of the chassis base 320. In addition, the chassis 320 comprises at least one corner aligning hole 325b positioned near a corner of the chassis 320. An center anti-reflective layer 347a surrounds the center aligning hole 325a, and a corner anti-reflective layer 347b surrounds the corner aligning hole 325b. The corner anti-reflective layer 347b surrounds the aligning hole 325b positioned near the corner of the chassis 320, as shown in FIG. 8. In this embodiment, the corner anti-reflective layer 347b extends to the outer edges of the corner of the chassis 320.

As shown in FIG. 8, the center anti-reflective layer 347a surrounds the center aligning hole 325a and is positioned near the center of the chassis 320. In the depicted embodiment, the center anti-reflective layer 347a is shaped to correspond to the shape of the aligning hole 325a. However, it is understood that the center anti-reflective layer 325a may take any suitable shape, and is not limited by the shape shown.

The anti-reflective layers 347a and 347b may comprise an anti-reflective material that is dark in color to reduce the reflection of outside light. The anti-reflective layers 347a and 347b may comprise a material selected from the group consisting of tape, plastic, silicon resin, graphite and metal. The corner of the chassis is structurally weak, and can therefore be reinforced by corner anti-reflective layer 347b comprising a plastic or metal having high strength.

In this embodiment, the anti-reflective layers 347a and 347b reduce reflexibility in the alignment area. In addition, by extending to the corner of the chassis 320, the corner anti-reflective layer 347b reinforces the structurally weak corner of the chassis 320.

The method of alignment of the chassis 320 and panel 310 according to this embodiment is substantially the same as the method for aligning the chassis 220 and panel 210, described above with reference to FIGS. 6 and 7. Accordingly, a repetitive description of that method is omitted.

Figure 9:
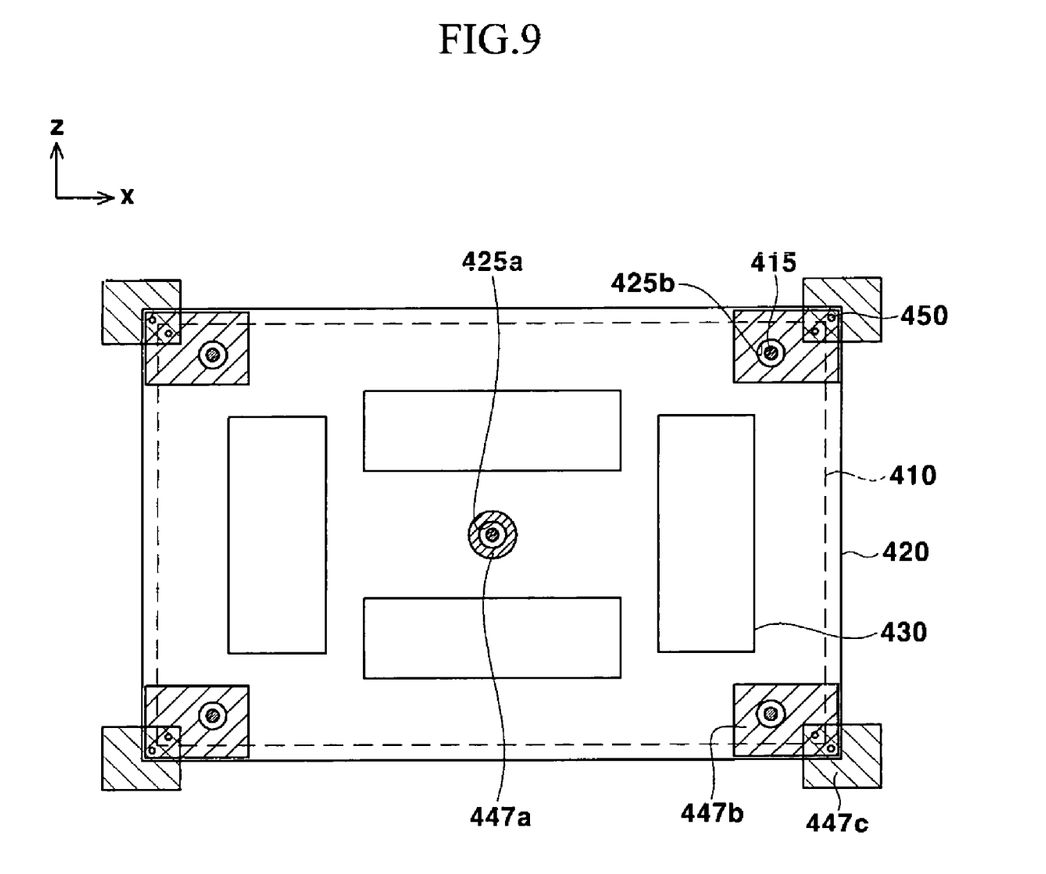
FIG. 9 is a plan view of a plasma display apparatus according to still yet another embodiment of the present invention.

FIG. 9 is a plan view of a plasma display apparatus according to another alternative embodiment of the present invention. As shown in FIG. 9, a center anti-reflective layer 447a surrounds a center aligning hole 425a positioned near the center of the chassis 420. In addition, a corner anti-reflective layer 447b surrounds a corner aligning hole 425b. The corner anti-reflective layer 447b extends to the corner of the panel 410 and comprises an extension layer 447c which extends beyond the corner of the chassis 420, as shown in FIG. 9.

The extension layer 447c may be integrated with the corner anti-reflective layer 447b. Alternatively, the extension layer 447c may be fixed to the chassis 420 at a position partially overlapping corner anti-reflective layer 447b. In the depicted embodiment, the extension layer 447c is fixed to the chassis by screws 450. However, it is understood that any means for fixing the extension layer 447c to the chassis may be used, and the invention is not limited to the means shown.

In FIG. 9, the center anti-reflective member 447a surrounding the center aligning hole 425a is positioned near the center of the chassis 420 and is shaped to correspond to the shape of the center aligning hole 425a. However, it is understood that the center anti-reflective layer 447a may take any suitable shape and the invention is not limited by the shape shown.

The anti-reflective layers 447a, 447b and 447c may comprise an anti-reflective material that is dark in color to reduce the reflection of outside light. The anti-reflective layers 447a, 447b and 447c may comprise a material selected from the group consisting of tape, plastic, silicon resin, graphite and metal.

The corner anti-reflective layer 447b and extension layer 447c, which can comprise a plastic or metal, can reinforce the corner of the chassis 420. Also, the chassis 420 of the plasma display apparatus is secured by fixing the extension layer 447c to the back cover (not shown).

The method of alignment of the chassis 420 and panel 410 according to this embodiment is substantially the same as the method for aligning the chassis 220 and panel 210, described above with reference to FIGS. 6 and 7. Accordingly, a repetitive description of that method is omitted.

Although the present invention has been described in detail with reference to exemplary embodiments, it is understood that many variations and/or modifications can be made without departing from the spirit and scope of the present invention, as defined in the appended claims.

What is claimed is:

1. A plasma display apparatus comprising:
    a plasma display panel comprising at least one aligning mark; and
    a chassis having first and second surfaces, the chassis comprising at least one aligning hole corresponding in position to a position of the at least one aligning mark on the plasma display panel, wherein the plasma display panel is attached to the first surface of the chassis, the chassis comprising aluminum and an anti-reflective material, wherein the anti-reflective material is present in an amount ranging from about 12 to about 26 parts by weight per 100 parts by weight aluminum.

2. The plasma display apparatus of claim 1, wherein the anti-reflective material is selected from the group consisting of silicon, zinc, copper and mixtures thereof.

3. The plasma display apparatus of claim 2, wherein the anti-reflective material comprises at least two materials selected from the group consisting of silicon, zinc and copper.

4. The plasma display apparatus of claim 2, wherein the chassis comprises aluminum and the anti-reflective material comprises silicon in an amount ranging from about 10 to about 18 parts by weight per 100 parts by weight aluminum.

5. The plasma display apparatus of claim 2, wherein the chassis comprises aluminum and the anti-reflective material comprises zinc in an amount ranging from about 0 to about 4 parts by weight per 100 parts by weight aluminum.

6. The plasma display apparatus of claim 2, wherein the chassis comprises aluminum and the anti-reflective material comprises copper in an amount ranging from about 2 to about 4 parts by weight per 100 parts by weight aluminum.

7. The plasma display apparatus of claim 2, wherein the chassis comprises aluminum and the anti-reflective material comprises:

silicon in an amount ranging from about 10 to about 18 parts by weight per 100 parts by weight aluminum;

zinc in an amount ranging from about 0 to about 4 parts by weight per 100 parts by weight aluminum; and copper in an amount ranging from about 2 to about 4 parts by weight per 100 parts by weight aluminum.

8. The plasma display apparatus of claim 7, wherein the chassis further comprises:

magnesium in an amount less than about 0.2 parts by weight per 100 parts by weight aluminum; and iron in an amount less than about 1.5 parts by weight per 100 parts by weight aluminum.

9. The plasma display apparatus of claim 1, wherein the chassis comprises electrogalvanized iron.

10. The plasma display apparatus of claim 1, wherein the reflexibility of the chassis is less than about 45%.

11. A plasma display apparatus comprising:

a plasma display panel comprising at least one aligning mark; and a chassis having first and second surfaces, the chassis comprising at least one aligning hole corresponding in position to a position of the at least one aligning mark on the plasma display panel, wherein the plasma display panel is attached to the first surface of the chassis, the chassis comprising at least one anti-reflective layer on the second surface of the chassis, the second surface facing away from the plasma display panel.

12. The plasma display apparatus of claim 11, wherein the anti-reflective layer is positioned on the entire second surface of the chassis.

13. The plasma display apparatus of claim 12, wherein the chassis comprises a material selected from the group consisting of aluminum and steel, and the anti-reflective layer comprises zinc.

14. The plasma display apparatus of claim 12, wherein the chassis comprises electrogalvanized iron.

15. The plasma display apparatus of claim 11, wherein the anti-reflective layer surrounds the aligning hole.

16. The plasma display apparatus of claim 15, wherein the anti-reflective layer surrounds the aligning hole and is shaped to correspond to a shape of the aligning hole.

17. The plasma display apparatus of claim 15, wherein the at least one aligning hole is positioned near a corner of the chassis, and the at least one anti-reflective layer surrounds the aligning hole near the corner of the chassis, the anti-reflective layer extending to the corner of the chassis and being shaped to correspond to the shape of the corner of the chassis.

18. The plasma display apparatus of claim 17, wherein the anti-reflective layer further comprises an extension layer extending beyond the corner of the chassis.

19. The plasma display apparatus of claim 11, wherein the anti-reflective layer comprises a material selected from the group consisting of plastic, metal, tape, silicon resin and graphite.

20. The plasma display apparatus of claim 11, wherein the anti-reflective layer is dark in color.

21. The plasma display apparatus of claim 11, wherein the reflexibility of the chassis is less than about 45%.

* * * * *